United States Patent
Chen et al.

(10) Patent No.: US 12,142,601 B2
(45) Date of Patent: Nov. 12, 2024

(54) MICRO LIGHT-EMITTING DIODE PACKAGE STRUCTURE AND MICRO LIGHT-EMITTING DIODE DISPLAY APPARATUS

(71) Applicant: PlayNitride Display Co., Ltd., MiaoLi County (TW)

(72) Inventors: Yen-Yeh Chen, MiaoLi County (TW); Yung-Chi Chu, MiaoLi County (TW)

(73) Assignee: PlayNitride Display Co., Ltd., MiaoLi County (TW)

( * ) Notice: Subject to any disclaimer, the term of this patent is extended or adjusted under 35 U.S.C. 154(b) by 467 days.

(21) Appl. No.: 17/517,691

(22) Filed: Nov. 3, 2021

(65) Prior Publication Data

US 2023/0091828 A1 Mar. 23, 2023

(30) Foreign Application Priority Data

Sep. 23, 2021 (TW) ................. 110135303

(51) Int. Cl.
*H01L 25/075* (2006.01)
*H01L 33/58* (2010.01)
*H01L 33/62* (2010.01)

(52) U.S. Cl.
CPC .......... *H01L 25/0753* (2013.01); *H01L 33/58* (2013.01); *H01L 33/62* (2013.01)

(58) Field of Classification Search
CPC ...... H01L 25/0753; H01L 33/58; H01L 33/62
USPC .......................................................... 257/89
See application file for complete search history.

(56) References Cited

U.S. PATENT DOCUMENTS

| 2018/0033919 | A1* | 2/2018 | Lee | ................. H01L 33/58 |
| 2018/0261535 | A1 | 9/2018 | Lin et al. | |
| 2021/0098438 | A1* | 4/2021 | Zhang | ................. H01L 25/167 |
| 2021/0265540 | A1 | 8/2021 | Itou et al. | |

FOREIGN PATENT DOCUMENTS

| CN | 102044614 | 5/2011 |
| CN | 104064655 | 9/2014 |
| CN | 108922884 | 11/2018 |
| CN | 110718593 | 1/2020 |
| CN | 112054017 | 12/2020 |
| CN | 112736072 | 4/2021 |

(Continued)

OTHER PUBLICATIONS

"Office Action of Taiwan Counterpart Application", issued on May 5, 2022, p. 1-p. 6.

(Continued)

*Primary Examiner* — Fazli Erdem
(74) *Attorney, Agent, or Firm* — JCIPRNET (57) ABSTRACT

A micro light-emitting diode package structure including a first base layer, a second base layer and a display unit is provided. The second base layer is disposed on the first base layer and has an opening. The opening exposes a part of the first base layer, and the opening and the exposed first base layer define a containing groove. The display unit is disposed in the containing groove, and the display unit includes a control circuit board and a micro light-emitting diode assembly. The micro light-emitting diode assembly is disposed on the control circuit board and electrically connected to the control circuit board.

14 Claims, 6 Drawing Sheets

(56) References Cited

FOREIGN PATENT DOCUMENTS

| | | | |
|---|---|---|---|
| CN | 113299746 | | 8/2021 |
| CN | 114899182 A | * | 8/2022 |
| KR | 20190051824 | | 5/2019 |
| TW | 201926667 | | 7/2019 |
| TW | 201944383 | | 11/2019 |
| TW | 202127654 | | 7/2021 |

OTHER PUBLICATIONS

"Office Action of China Counterpart Application", issued on Mar. 27, 2024, p. 1-p. 8.

* cited by examiner

MICRO LIGHT-EMITTING DIODE PACKAGE STRUCTURE AND MICRO LIGHT-EMITTING DIODE DISPLAY APPARATUS

CROSS-REFERENCE TO RELATED APPLICATION

This application claims the priority benefit of Taiwan application serial no. 110135303, filed on Sep. 23, 2021. The entirety of the above-mentioned patent application is hereby incorporated by reference herein and made a part of this specification.

BACKGROUND

Technical Field

The invention relates to a package structure and a display apparatus, and particularly relates to a micro light-emitting diode package structure and a micro light-emitting diode display apparatus.

Description of Related Art

Generally, in order to facilitate a circuit controlling light-emitting diodes, it is usually necessary to transfer the light-emitting diodes to a complementary metal-oxide-semiconductor (CMOS) wafer, and then perform subsequent manufacturing processes, and finally bond the light-emitting diodes to a driving substrate. However, since most of the equipment used in semiconductor factories produces wafers of 8 inches or more, while light-emitting diode factories generally use equipment corresponding to 4-inch or 6-inch wafers in epitaxy of the light-emitting diodes and subsequent manufacturing processes, so that it is liable to cause dimension inconsistency, as a result, the light-emitting diodes and an integrated circuit (IC) die cannot be directly connected. In addition, if, brushing off the construction cost of the 8-inch wafer factory equipment, the light-emitting diodes are transferred to 8-inch wafer factory equipment in batches for subsequent processing, due to the requirements on an overall exposure flatness, even if the connected IC die is a defective product, the light-emitting diodes must still be placed thereon, which results in waste of cost.

In addition, the higher a resolution of an exposure machine (such as stepper exposure machine) is, the higher wafer flatness is required. Therefore, if the IC die is directly bonded to the driving substrate for subsequent processes, it is liable to cause an excessive height difference (for example, greater than 550 μm) between the IC die and the driving substrate due to a thickness of the IC die to increase exposure difficulty. In order to resolve the above problem of height difference, the existing manufacturing process adopts a wire bonding method to connect the IC die and the driving substrate, which occupies more space and reduces the number of dies on a single silicon wafer.

SUMMARY

The invention is directed to a micro light-emitting diode package structure, which has a thinner package thickness and better structure flatness.

The invention is directed to a micro light-emitting diode display apparatus, which includes a plurality of the above-mentioned micro light-emitting diode package structures, and has a thinner package thickness and better structure flatness.

The invention provides a micro light-emitting diode package structure including a first base layer, a second base layer and a display unit. The second base layer is disposed on the first base layer and has an opening. The opening exposes a part of the first base layer, and the opening and the exposed first base layer define a containing groove. The display unit is disposed in the containing groove, and the display unit includes a control circuit board and a micro light-emitting diode assembly. The micro light-emitting diode assembly is disposed on the control circuit board and electrically connected to the control circuit board.

In an embodiment of the invention, at least one of the first base layer and the second base layer is a substrate, and the substrate includes a printed circuit board, a glass substrate, a sapphire substrate or a silicon substrate.

In an embodiment of the invention, the control circuit board has a first top surface away from the first base layer, and the second base layer has a second top surface away from the first base layer, and a height difference between the first top surface and the second top surface is less than or equal to 50 μm.

In an embodiment of the invention, the second base layer further includes a padding layer, which is disposed on a side of the second base layer away from the first base layer, and a surface of the padding layer away from the first base layer defines the second top surface.

In an embodiment of the invention, the control circuit board includes a first pad, and the second base layer further includes a second pad and a padding layer. The second pad is disposed on a side of the second base layer away from the first base layer. The padding layer covers the second pad and has a via exposing the second pad. The micro light-emitting diode package structure further includes a conductive structure. The conductive structure extends from the first pad to a surface of the padding layer and is electrically connected to the second pad through the via.

In an embodiment of the invention, the micro light-emitting diode package structure further includes a light guide layer disposed on the second base layer and covering the micro light-emitting diode assembly.

In an embodiment of the invention, the control circuit board includes a first pad. The second base layer includes a second pad, and has a first surface and a second surface opposite to each other and connected through the opening. The second pad is disposed on the first surface or the second surface. The micro light-emitting diode package structure further includes a conductive structure disposed in the opening and connected to the first pad and the second pad.

In an embodiment of the invention, the second pad is disposed on the second surface, and a peripheral surface of the first base layer leans against the conductive structure, and a first bottom surface of the first base layer is aligned with a second bottom surface of the conductive structure.

In an embodiment of the invention, the first base layer is a coating layer, and a thickness of the first base layer is greater than 0 and less than 50 μm.

In an embodiment of the invention, the micro light-emitting diode package structure further includes a filling material layer disposed in the containing groove and located between the opening and the display unit.

In an embodiment of the invention, the control circuit board has a first top surface away from the first base layer, the filling material layer has a third top surface away from the first base layer, and the first top surface is aligned with the third top surface.

In an embodiment of the invention, the micro light-emitting diode package structure further includes a conductive structure and an insulating layer. The control circuit board includes a first pad. The insulating layer is disposed between the first base layer and the second base layer. The micro light-emitting diode assembly of the display unit directly contacts the insulating layer, and the insulating layer has a channel exposing the first pad. The conductive structure is disposed in the channel and electrically connected to the first pad.

In an embodiment of the invention, the first base layer of the micro light-emitting diode package structure is an insulating material layer.

The invention provides a micro light-emitting diode display apparatus including a driving substrate and a plurality of micro light-emitting diode package structures. The micro light-emitting diode package structures are separately arranged on the driving substrate and electrically connected to the driving substrate. Each micro light-emitting diode package structure includes a first base layer, a second base layer and a display unit. The second base layer is disposed on the first base layer and has an opening. The opening exposes a part of the first base layer, and the opening and the exposed first base layer define a containing groove. The display unit is disposed in the containing groove, and the display unit includes a control circuit board and a micro light-emitting diode assembly. The micro light-emitting diode assembly is disposed on the control circuit board and electrically connected to the control circuit board.

Based on the above description, in the design of the micro light-emitting diode package structure of the invention, the display unit is disposed in the containing groove defined by the opening of the second base layer and the first base layer, thereby avoiding the problem of excessive height difference caused by a thickness of the IC die in the prior art. Compared with the prior art where the IC die is directly bonded to the driving substrate, the micro light-emitting diode package structure of the invention may have a thinner package thickness and better structure flatness.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
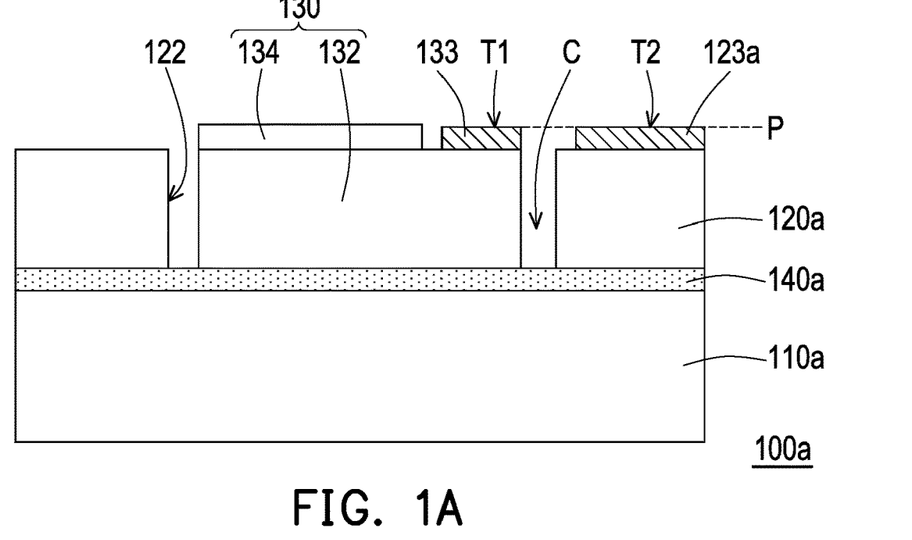
FIG. 1A is a schematic cross-sectional view of a micro light-emitting diode package structure according to an embodiment of the invention.
Figure 1B:
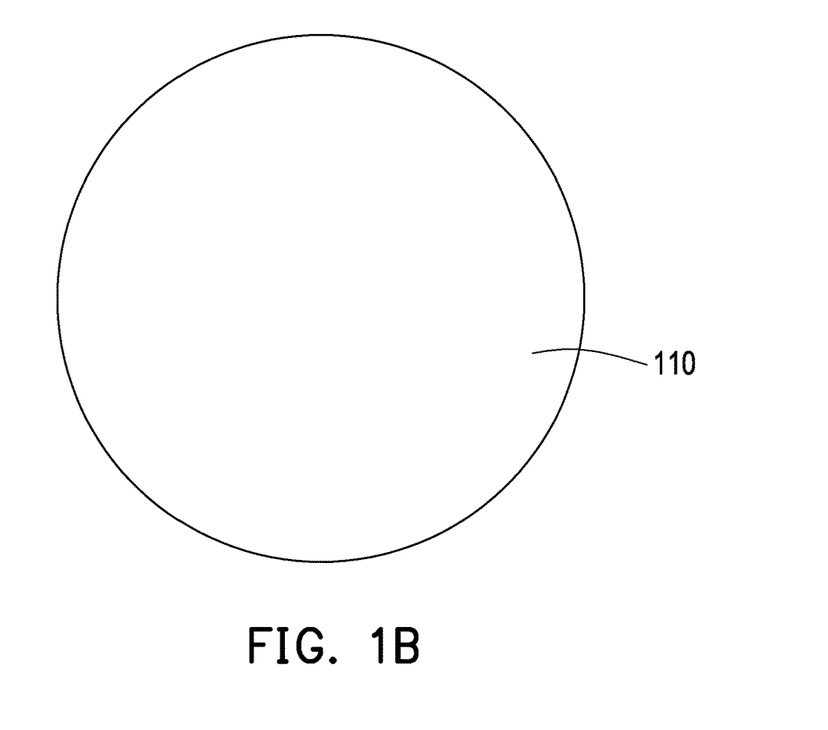
FIG. 1B and FIG. 1C are respectively a schematic top view of a first base layer and a second base layer before cutting.
Figure 1C:
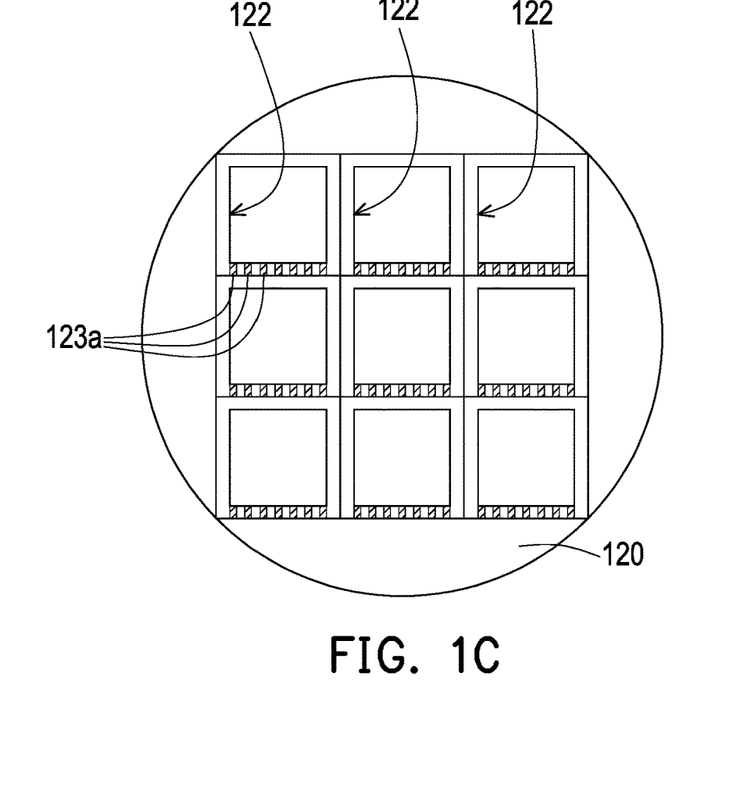

FIG. 1A is a schematic cross-sectional view of a micro light-emitting diode package structure according to an embodiment of the invention. FIG. 1B and FIG. 1C are respectively a schematic top view of a first base layer and a second base layer before cutting.

Referring to FIG. 1A first, in the embodiment, a micro light-emitting diode package structure 100a includes a first base layer 110a, a second base layer 120a, and a display unit 130. The second base layer 120a is disposed on the first base layer 110a and has an opening 122. The opening 122 exposes a part of the first base layer 110a, and the opening 122 and the exposed first base layer 110a define a containing groove C. The display unit 130 is disposed in the containing groove C, and the display unit 130 includes a control circuit board 132 and a micro light-emitting diode assembly 134. The micro light-emitting diode assembly 134 is disposed on the control circuit board 132 and is electrically connected to the control circuit board 132.

In detail, the control circuit board 132 of the display unit 130 includes a first pad 133, and the second base layer 120a includes a second pad 123a. The control circuit board 132 has a top surface T1 thereon, in FIG. 1A, the top surface T1 is, for example, located above the first pad 133, but the invention is not limited thereto. The second base layer 120a has a top surface T2 away from the second base layer 120a above the second pad 123a, and the top surface T1 and the top surface T2 are located on a same plane P. Namely, the top surface T1 of the first pad 133 and the top surface T2 of the second pad 123a have no height difference or approximately aligned. Moreover, the micro light-emitting diode assembly 134 of the display unit 130 of the embodiment includes a plurality of micro light-emitting diodes, and light emitted by the micro light-emitting diodes is different. To be specific, the micro light-emitting diodes include a red micro light-emitting diode, a green micro light-emitting diode and a blue micro light-emitting diode, and the red micro light-emitting diode, the green micro light-emitting diode and the blue micro light-emitting diode define a pixel, but the invention is not limited thereto. In addition, the micro light-emitting diode package structure 100a of the embodiment further includes an adhesive layer 140a, where the adhesive layer 140a is disposed between the first base layer 110a and the second base layer 120a, and the control circuit board 132 of the display unit 130 directly contacts the adhesive layer 140a. The adhesive layer 140a is used to fix the display unit 130 on the first base layer 110a. Preferably, the adhesive layer 140a may also serve as an insulating layer herein. Namely, a material of the adhesive layer 140a may be an organic material with an electrical insulation property.

More specifically, referring to FIG. 1A and FIG. 1B together, the first base layer 110a of the embodiment is, for example, a part of a substrate 110, and the first base layer 110a is obtained by singulating the substrate 110 by cutting. The substrate 110 is, for example, a printed circuit board, a glass substrate, a sapphire substrate or a silicon substrate, but the invention is not limited thereto. Then, Referring to FIGS. 1A and 1C together, the second base layer 120a of the embodiment is, for example, a part of a substrate 120, where the substrate 120 has a plurality of openings 122 and a plurality of second pads 123a located on one side of the opening 122. The second base layer 120a having the opening 122 and the second pads 123a is obtained by singulating the substrate 110 by cutting. The substrate 120 is, for example, a printed circuit board, a glass substrate, a sapphire substrate, or a silicon substrate, but the invention is not limited thereto. The first base layer 110a is embodied as a silicon substrate, and the second base layer 120a is embodied as a printed circuit board, but the invention is not limited thereto. Preferably, a size of the first base layer 110a and a size of the second base layer 120a are approximately the same or substantially the same. It should be noted that in other embodiments, at least one of the first base layer 110a and the second base layer 120a may be a substrate, where the substrate is, for example, a printed circuit board, a glass substrate, a sapphire substrate, or a silicon substrate, which still belongs to a protection scope of the invention.

In terms of fabrication, first, the substrate 110 and the substrate 120 of the same size as an epitaxial substrate are fabricated. Then, the opening 122 and the second pad 123a of the substrate 120 are fabricated, and the substrate 120 is disposed on the substrate 110, so that the opening 122 of the substrate 120 and the substrate 110 define the containing groove C. Thereafter, the display unit 130 is disposed in the containing groove C. Finally, a singulation process is performed to cut the substrate 110 and the substrate 120 to complete fabrication of the micro light-emitting diode package structure 100a.

In the design of the micro light-emitting diode package structure 100a of the embodiment, the display unit 130 is disposed in the containing groove C defined by the opening 122 of the second base layer 120a and the first base layer 110a, so as to prevent the problem of excessive height difference caused by the thickness of the IC die in the prior art. In other words, by pre-forming the recessed containing groove C between the top surface T2 of the second base layer 120a and the base layer 110a, the height difference between the display unit 130 and the surrounding base layer due to its own thickness is greatly reduced, so as to reduce the difficulty of subsequent exposure process. In addition, the top surface T1 of the first pad 133 of the control circuit board 132 and the top surface T2 of the second pad 123a of the second base layer 120a have no height difference therebetween or approximately aligned, so that there is no need for subsequent electrical connection through wire bonding, which may reduce an overall package thickness. In brief, compared with the prior art where the IC die is directly bonded to the driving substrate, the micro light-emitting diode package structure 100a of the embodiment may have a thinner package thickness and higher structure flatness.

It should be noted that reference numbers of the components and a part of contents of the aforementioned embodiment are also used in the following embodiment, where the same reference numbers denote the same or like components, and descriptions of the same technical contents are omitted. The aforementioned embodiment may be referred for descriptions of the omitted parts, and detailed descriptions thereof are not repeated in the following embodiment.

Figure 2:
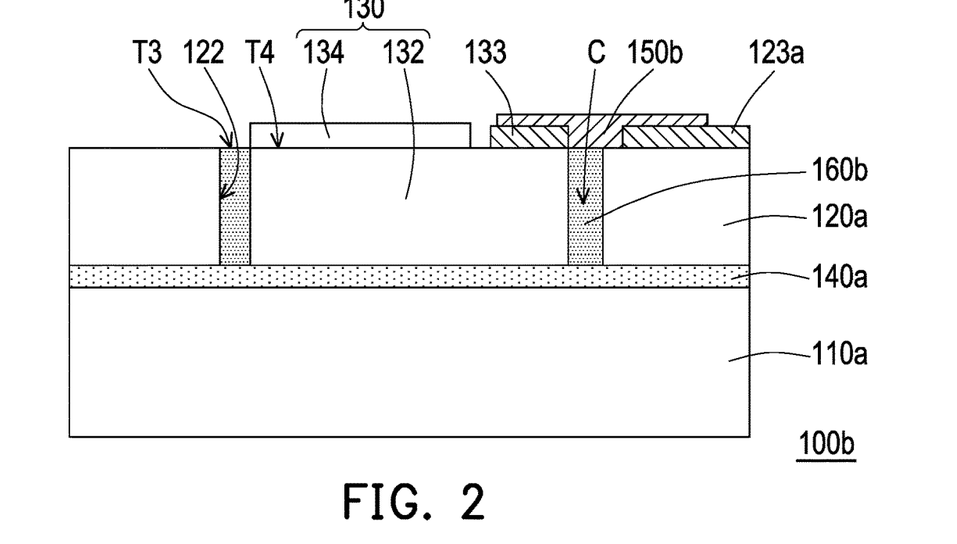
FIG. 2 is a schematic cross-sectional view of a circuit connection of the micro light-emitting diode package structure of FIG. 1A.

FIG. 2 is a schematic cross-sectional view of a circuit connection of the micro light-emitting diode package structure of FIG. 1A. In the subsequent application of the micro light-emitting diode package structure 100a of FIG. 1A, since the micro light-emitting diode package structure of FIG has high flatness, there is no need to adopt wire bonding, and the metal layout thereof can be directly deposited by photolithography process. In detail, referring to FIG. 2, in the embodiment, the micro light-emitting diode package structure 100b further includes a conductive structure 150b, where the conductive structure 150b is electrically connected to the first pad 133 of the control circuit board 132 and the second pad 123a of the second base layer 120a. The conductive structure 150b is formed by, for example, a photolithography process, and a material thereof is, for example, metal, therefore the pixel density can be increased. The second pad 123a may be a part of a circuit on the second base layer 120a. Namely, in a preferred embodiment, the second base layer 120a may be a printed circuit board, and the second pad 123a is not limited to the structure shown in FIG. 2, but may be a metal circuit, an ohmic contact or other suitable patterns.

In addition, in order to lighten the influence on the subsequent manufacturing processes of the micro light-emitting diode package structure 100a in FIG. 1A, a micro light-emitting diode package structure 100b of the embodiment may selectively include a filling material layer 160b, where the filling material layer 160b is disposed in the containing groove C and located between the opening 122 and the display unit 130. The filling material layer 160b has a top surface T3 away from the first base layer 110a, and the control circuit board 130 has a top surface T4 away from the first base layer 110a, and the top surface T3 is substantially aligned with or approximately aligned with the top surface T4, so as to improve flatness. A material of the filling material layer 160b is, for example, an organic material, which is used to fill a gap between the display unit 130 and the containing groove C, thereby lightening the influence on the subsequent manufacturing processes.

Figure 3:
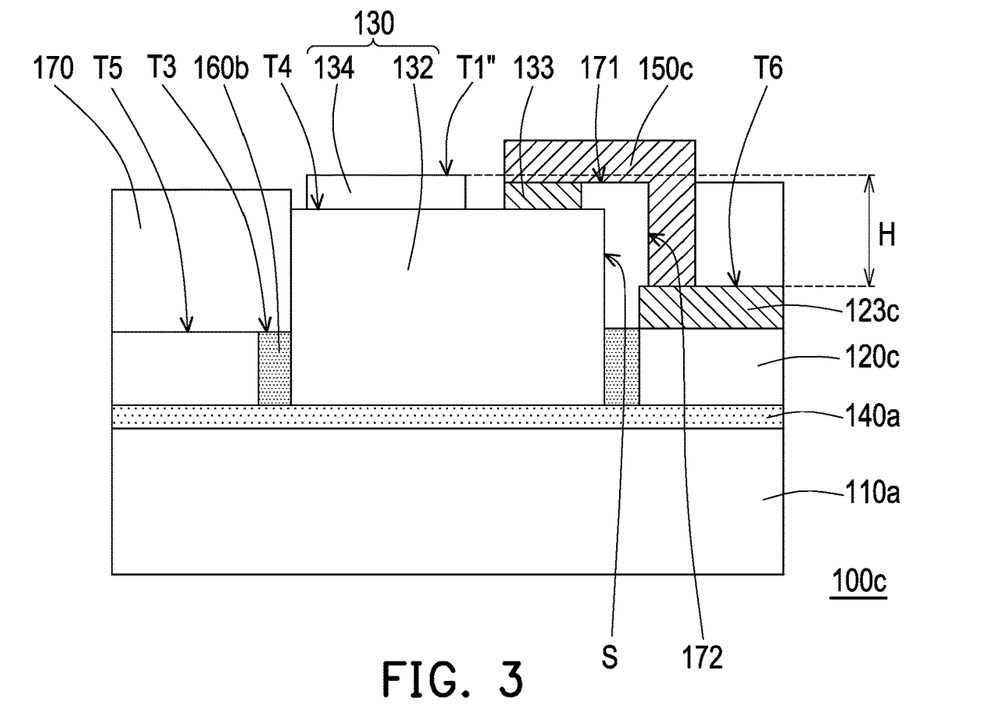
FIG. 3 is a schematic cross-sectional view of a micro light-emitting diode package structure according to another embodiment of the invention.

FIG. 3 is a schematic cross-sectional view of a micro light-emitting diode package structure according to another embodiment of the invention. Referring to FIG. 2 and FIG. 3 together, a micro light-emitting diode package structure 100c of the embodiment is similar to the micro light-emitting diode package structure 100b of FIG. 2, and a difference therebetween is that in the embodiment, the control circuit board 132 and the second pad 123c of the second base layer 120c have a height difference H. In detail, the control circuit board 132 has a top surface T1", and the top surface T1" is, for example, a top surface of the micro light-emitting diode assembly 134. In the embodiment, there is the height difference H between the top surface T1" of the control circuit board 132 and a top surface T6 of the second pad 123c, and the height difference H is, for example, less than or equal to 50 μm. Correspondingly, a width of the micro light-emitting diode assembly 134 is, for example, 30 μm to 50 μm. However, referring to FIG. 1C together, with decrease of an exposure line width and spacing of the exposure machine, the number of the micro light-emitting diode assemblies 134 per unit area may be increased with the smaller size thereof, and the height difference H may decrease accordingly. Moreover, the height difference H is preferably 20 μm or less. The top surface T3 of the filling material layer 160*b* is substantially aligned or approximately aligned with a top surface T5 of the second base layer 120*c*, and the top surface T4 of the control circuit board 130 protrudes out from the top surface T3 of the filling material layer 160*b*.

In addition, the micro light-emitting diode package structure 100*c* of the embodiment further includes a padding layer 170, where the padding layer 170 is disposed on the second base layer 120*c* and covers a peripheral surface S of the control circuit board 132. As shown in FIG. 3, the peripheral surface S of the control circuit board 132 is covered by the padding layer 170 and the filling material layer 160*b*. Further, the padding layer 170 has a via 172 exposing the second pad 123*c*, and a conductive structure 150*c* extends from the first pad 133 to a surface 171 of the padding layer 170 and is electrically connected to the second pad 123*c* through the via 172. A material of the padding layer 170 includes an insulating material or an organic material, and is to eliminate the height difference H between the first pad 133 and the second pad 123*c*, so as to improve the flatness of the micro light-emitting diode package structure 100*c*.

Figure 4:
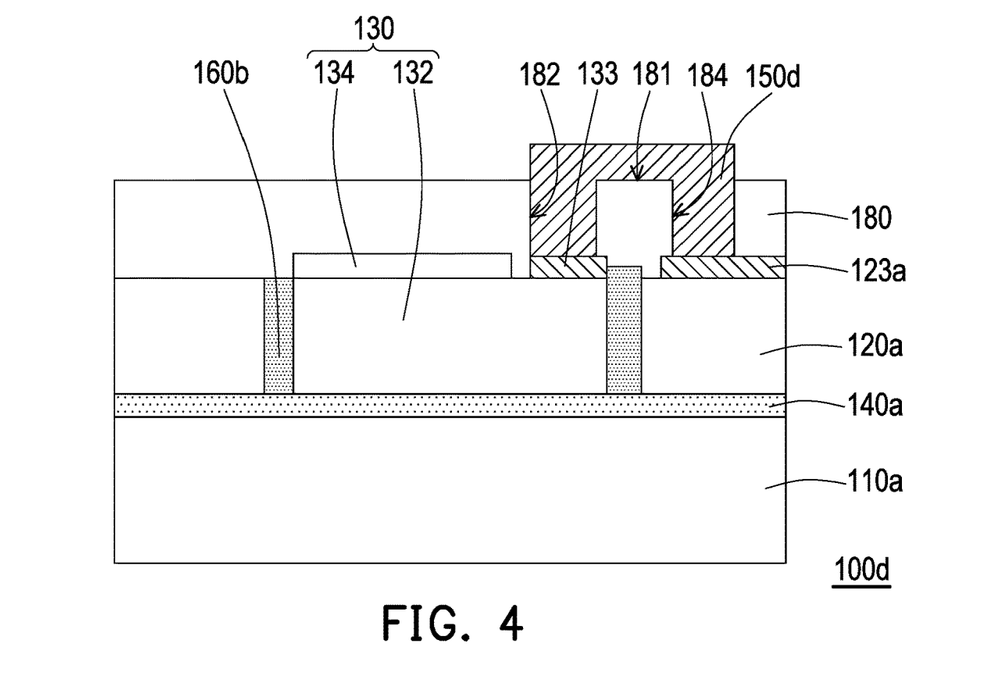
FIG. 4 is a schematic cross-sectional view of a micro light-emitting diode package structure according to another embodiment of the invention.

FIG. 4 is a schematic cross-sectional view of a micro light-emitting diode package structure according to another embodiment of the invention. Referring to FIG. 2 and FIG. 4 together, a micro light-emitting diode package structure 100*d* of the embodiment is similar to the micro light-emitting diode package structure 100*b* of FIG. 2, and a difference therebetween is that: in the embodiment, the micro light-emitting diode package structure 100*d* further includes a light guide layer 180, where the light guide layer 180 is disposed on the second base layer 120*a* and covers the micro light-emitting diode assembly 134, the filling material layer 160*b* and the second base layer 120*a*. The light guide layer 180 has a first via 182 and a second via 184 exposing the first pad 133 and the second pad 123*a*. A conductive structure 150*d* extends from a surface 181 of the light guide layer 180 into the first via 182 and the second via 184 for electrically connecting the first pad 133 and the second pad 123*a*. A material of the light guide layer 180 is, for example, an insulating material or an organic material, and has high light transmittance.

Figure 5A:
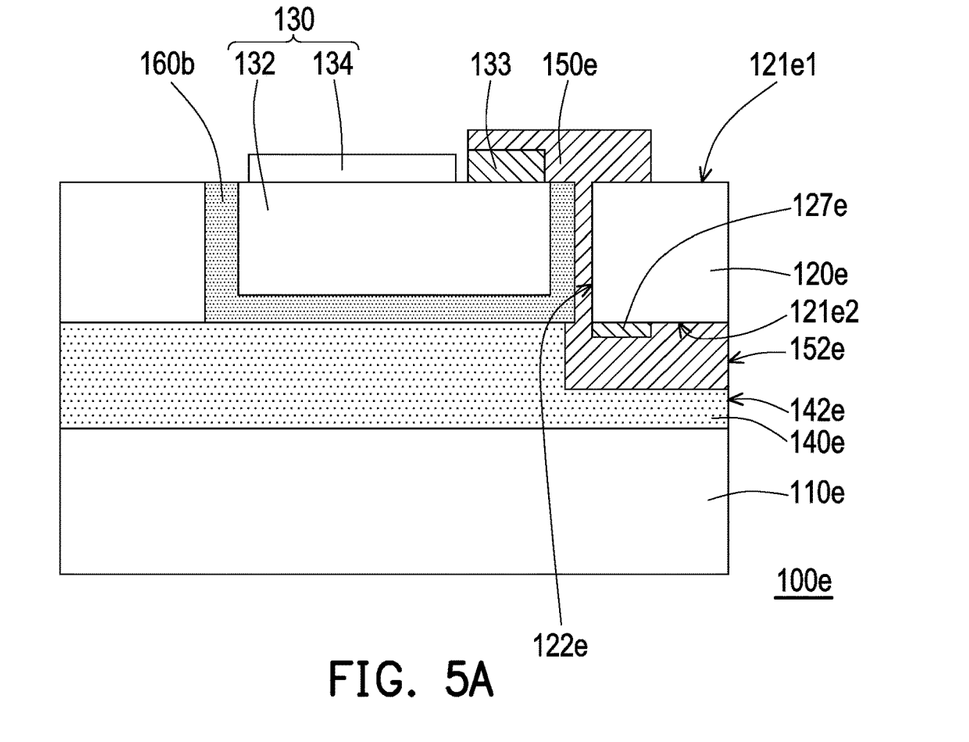
FIG. 5A is a schematic cross-sectional view of a micro light-emitting diode package structure according to another embodiment of the invention.

FIG. 5A is a schematic cross-sectional view of a micro light-emitting diode package structure according to another embodiment of the invention. Referring to FIG. 2 and FIG. 5A together, a micro light-emitting diode package structure 100*e* of the embodiment is similar to the micro light-emitting diode package structure 100*b* of FIG. 2, and a difference therebetween is that in the embodiment, structures of a conductive structure 150*e* and a second base layer 120*e* of the micro light-emitting diode package structure 100*e* are different from that of the conductive structure 150*b* and the second base layer 120*a* of FIG. 2.

In detail, the second base layer 120*e* has a first surface 121*e*1 and a second surface 121*e*2 opposite to each other, and further includes a second pad 127*e*. An opening 122*e* connects the first surface 121*e*1 and the second surface 121*e*2, and the second pad 127*e* is disposed on the second surface 121*e*2. The conductive structure 150*e* is disposed in the opening 122*e* and connects the first pad 133 and the second pad 127*e*. An adhesive layer 140*e* covers the conductive structure 150*e*.

Figure 5B:
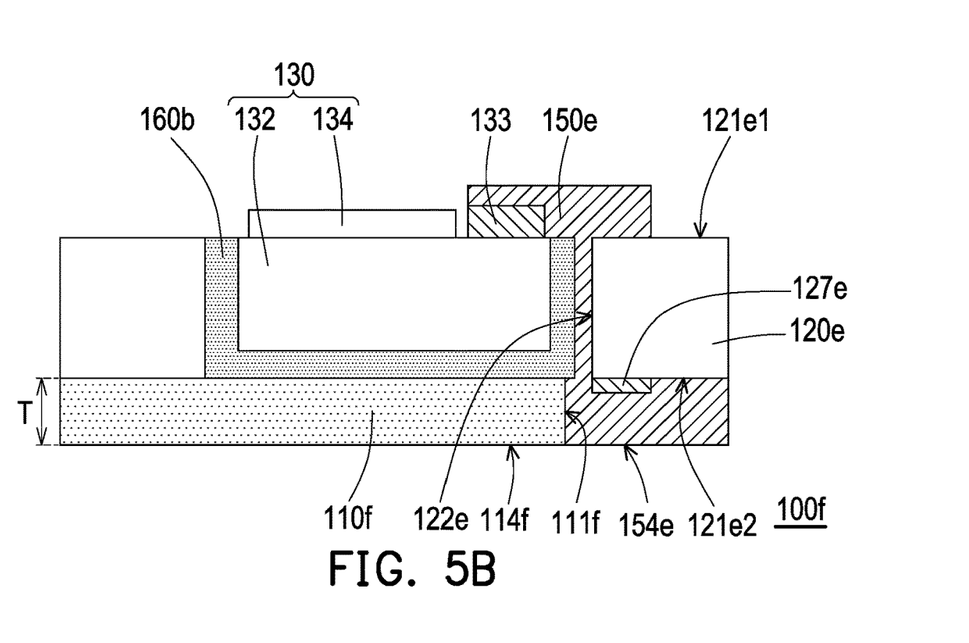
FIG. 5B is a schematic cross-sectional view of the micro light-emitting diode package structure of FIG. 5A with a temporary base layer removed.

FIG. 5B is a schematic cross-sectional view of the micro light-emitting diode package structure of FIG. 5A with a temporary base layer removed. In the subsequent manufacturing process of FIG. 5A, a temporary base layer 110*e* and a part of the adhesive layer 140*e* may be removed to reduce the overall thickness of the micro light-emitting diode package structure. In detail, referring to FIG. 5B, in the embodiment, a first base layer 110*f* is embodied as a coating layer, which is the remained adhesive layer 140*e* in FIG. 5A, but the invention is not limited thereto. In other embodiments, the first substrate 110*f* may also be an insulating material layer. Preferably, a thickness T of the first base layer 110*f* is greater than 0 and less than 50 μm. In particular, a peripheral surface 111*f* of the first base layer 110*f* leans against the conductive structure 150*e*, and a first bottom surface 114*f* of the first base layer 110*f* is substantially aligned or approximately aligned with a second bottom surface 154*e* of the conductive structure 150*e*.

In brief, the temporary base layer 110*e* of FIG. 5A only provides temporary support for the display unit 130, the second base layer 120*e*, and the filling material layer 160*b*, where the display unit 130, the second base layer 120*e* and the filling material layer 160*b* may be fixed to the temporary base layer 110*e* through the adhesive layer 140*e*. In the subsequent manufacturing process, referring to FIG. 5A and FIG. 5B together, in order to reduce the overall thickness of the micro light-emitting diode package structure, the temporary base layer 110*e* and a part of the adhesive layer 140*e* may be removed, and the remained adhesive layer 140*e* for fixing the display unit 130, the second base layer 120*e* and the filling material layer 160*b* may be regarded as the first base layer 110*f*.

Figure 6A:
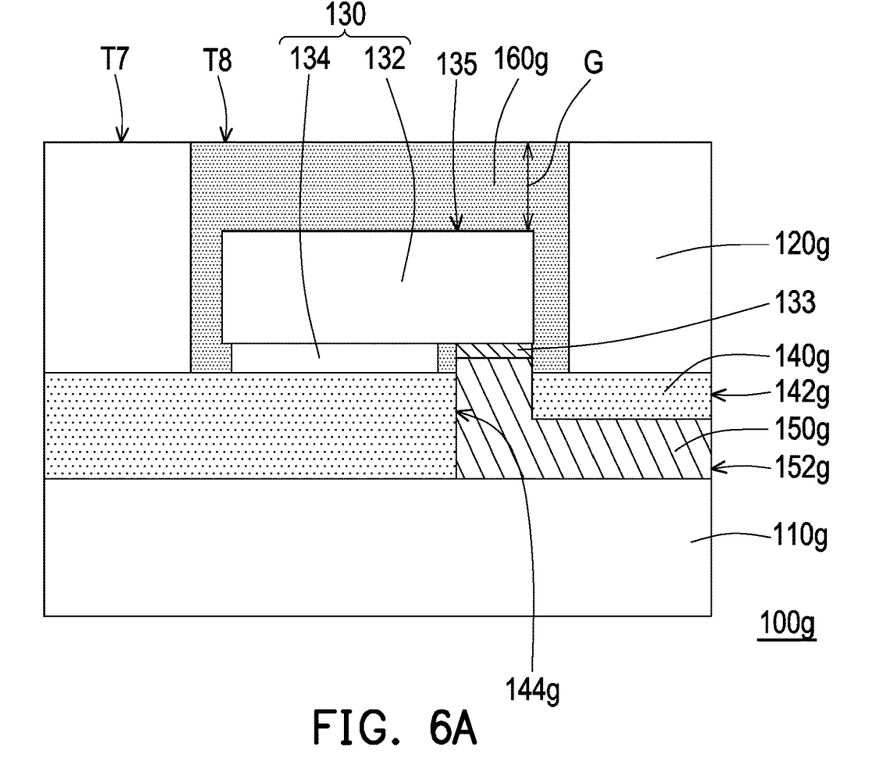
FIG. 6A is a schematic cross-sectional view of a micro light-emitting diode package structure according to another embodiment of the invention.

FIG. 6A is a schematic cross-sectional view of a micro light-emitting diode package structure according to another embodiment of the invention. Referring to FIG. 2 and FIG. 6A together, a micro light-emitting diode package structure 100*g* of the embodiment is similar to the micro light-emitting diode package structure 100*b* of FIG. 2, and a difference there between is that in the embodiment, a filling material layer 160*g* completely wraps the control circuit board 132, and has a gap G with a top surface 135 of the control circuit board 132. A top surface T7 of the second base layer 120*g* is substantially aligned with or approximately aligned with a top surface T8 of the filling material layer 160*g*.

Namely, referring to FIG. 3 and FIG. 6A together, if there is the height difference H between the top surface T1" of the control circuit board 132 and the top surface T6 of the second pad 123*c* in FIG. 3, the padding layer 170 may be added to eliminate the height difference H between the first pad 133 and the second pad 123*c*, so as to improve the flatness of the micro light-emitting diode package structure 100*c*. In FIG. 6A, if the top surface 135 of the control circuit board 132 and the top surface T7 of the second base layer 120*g* have the gap G, the gap G may be filled by the filling material layer 160*g* to improve the flatness of the micro light-emitting diode package structure 100 *g*.

In addition, in the embodiment, the micro light-emitting diode package structure 100*g* further includes a conductive structure 150*g*. In detail, in the embodiment, the micro light-emitting diode assembly 134 of the display unit 130 directly contacts an adhesive layer 140*g*, and the adhesive layer 140*g* has a channel 144*g* exposing the first pad 133. The conductive structure 150*g* is disposed in the channel 144*g* and is electrically connected to the first pad 133 of the control circuit board 132. A first side surface 142*g* of the adhesive layer 140*g* is substantially aligned with or approximately aligned with a second side surface 152*g* of the conductive structure 150*g*.

Figure 6B:
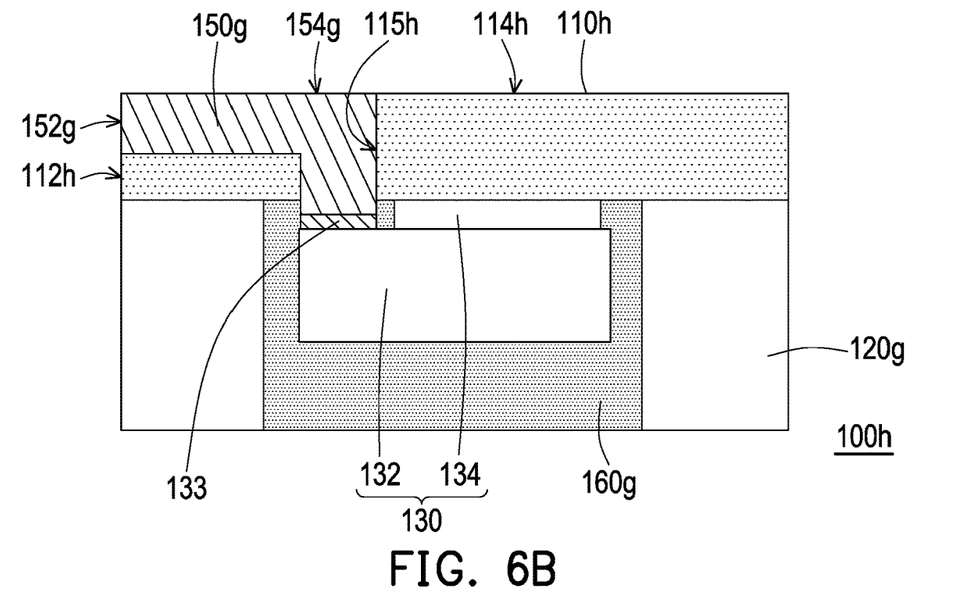
FIG. 6B is a schematic cross-sectional view of the micro light-emitting diode package structure of FIG. 6A with a temporary base layer removed.

FIG. 6B is a schematic cross-sectional view of the micro light-emitting diode package structure of FIG. 6A with a temporary base layer removed. In the subsequent manufacturing process of FIG. 6A, a temporary base layer 110g may be removed to reduce the overall thickness of the micro light-emitting diode package structure. In detail, referring to FIGS. 6A and 6B together, in the embodiment, a first base layer 110h is embodied as an insulating layer, i.e. the adhesive layer 140g exposed after the temporary base layer 110g in FIG. 6A is removed may be regarded as the first base layer 110h of the embodiment. The first base layer 110h has a channel 115h exposing the first pad 133, where the micro light-emitting diode assembly 134 of the display unit 130 directly contacts the first base layer 110h. In particular, a first bottom surface 114h of the first base layer 110h is substantially aligned with or approximately aligned with a second bottom surface 154g of the conductive structure 150g. A first side surface 112h of the first base layer 110h is substantially aligned or approximately aligned with a second side surface 152g of the conductive structure 150g.

In brief, the temporary base layer 110g of FIG. 6A only provides temporary support for the display unit 130, the second base layer 120g, and the filling material layer 160g, where the display unit 130, the second base layer 120g and the filling material layer 160g may be fixed to the temporary base layer 110g through the adhesive layer 140g. In the subsequent manufacturing process, referring to FIG. 6A and FIG. 6B together, in order to reduce the overall thickness of the micro light-emitting diode package structure, the temporary base layer 110g may be removed, and the adhesive layer 140g for fixing the display unit 130, the second base layer 120g and the filling material layer 160g may be regarded as the first base layer 110h.

Figure 7:
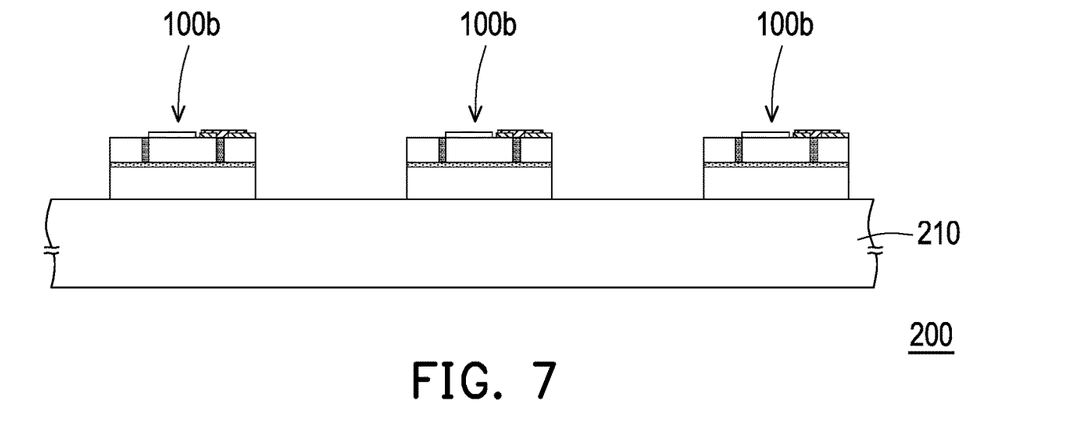
FIG. 7 is a schematic cross-sectional view of a micro light-emitting diode display apparatus according to an embodiment of the invention.

FIG. 7 is a schematic cross-sectional view of a micro light-emitting diode display apparatus according to an embodiment of the invention. Referring to FIG. 7, a micro light-emitting diode display apparatus 200 of the embodiment includes a driving substrate 210 and a plurality of micro light-emitting diode package structures 100b as shown in FIG. 2. The micro light-emitting diode package structures 100b are separately arranged on the driving substrate 210 and electrically connected to the driving substrate 210. The driving substrate 210 is, for example, a complementary metal-oxide-semiconductor (CMOS) substrate, a liquid crystal on silicon (LCOS) substrate, or a thin film transistor (TFT) substrate, or other substrates with working circuits, which is not limited by the invention.

In summary, in the design of the micro light-emitting diode package structure of the invention, the display unit is disposed in the containing groove defined by the opening of the second base layer and the first base layer, thereby avoiding the problem of excessive height difference caused by a thickness of the IC die in the prior art. Compared with the prior art where the IC die is directly bonded to the driving substrate, the micro light-emitting diode package structure of the invention may have a thinner package thickness and better structure flatness.

It will be apparent to those skilled in the art that various modifications and variations can be made to the disclosed embodiments without departing from the scope or spirit of the invention. In view of the foregoing, it is intended that the invention covers modifications and variations provided they fall within the scope of the following claims and their equivalents.

What is claimed is:

1. A micro light-emitting diode package structure, comprising:
    a first base layer;
    a second base layer, disposed on the first base layer, and having a first surface and a second surface opposite to each other and an opening passing through the second base layer and connecting the first surface and the second surface, wherein the opening has a top end and a bottom end opposite to each other, and the top end is connected to the first surface, the bottom end is connected to the second surface and located between the top end and the first base layer, wherein the bottom end of the opening exposes a part of the first base layer, and the opening and the exposed first base layer define a containing groove; and
    a display unit, disposed in the containing groove, and comprising:
        a control circuit board, wherein at least a portion of the control circuit board is located between the top end of the opening and the first base layer; and
        a micro light-emitting diode assembly, disposed on the control circuit board, and electrically connected to the control circuit board.

2. The micro light-emitting diode package structure as claimed in claim 1, wherein at least one of the first base layer and the second base layer is a substrate, and the substrate comprises a printed circuit board, a glass substrate, a sapphire substrate or a silicon substrate.

3. The micro light-emitting diode package structure as claimed in claim 1, wherein the control circuit board has a first top surface away from the first base layer, and the second base layer has a second top surface away from the first base layer, and a height difference between the first top surface and the second top surface is less than or equal to 50 µm.

4. The micro light-emitting diode package structure as claimed in claim 3, wherein the second base layer further comprises:
    a padding layer, disposed on a side of the second base layer away from the first base layer, and a surface of the padding layer away from the first base layer defining the second top surface.

5. The micro light-emitting diode package structure as claimed in claim 1, wherein the control circuit board comprises a first pad,
    the second base layer further comprises:
        a second pad, disposed on a side of the second base layer away from the first base layer; and
        a padding layer, covering the second pad, and having a via exposing the second pad;
    the micro light-emitting diode package structure further comprises:
    a conductive structure, extending from the first pad to a surface of the padding layer, and electrically connected to the second pad through the via.

6. The micro light-emitting diode package structure as claimed in claim 1, further comprising:
    a light guide layer, disposed on the second base layer, and covering the micro light-emitting diode assembly.

7. The micro light-emitting diode package structure as claimed in claim 1, wherein the control circuit board comprises a first pad; the second base layer further comprises a second pad, the second pad is disposed on the first surface or the second surface;
    the micro light-emitting diode package structure further comprises:
    a conductive structure, disposed in the opening and connected to the first pad and the second pad.

8. The micro light-emitting diode package structure as claimed in claim 7, wherein the second pad is disposed on the second surface, and a peripheral surface of the first base layer leans against the conductive structure, and a first bottom surface of the first base layer is aligned with a second bottom surface of the conductive structure.

9. The micro light-emitting diode package structure as claimed in claim 8, wherein the first base layer is a coating layer, and a thickness of the first base layer is greater than 0 and less than 50 μm.

10. The micro light-emitting diode package structure as claimed in claim 1, further comprising:
a filling material layer, disposed in the containing groove, and located between the opening and the display unit.

11. The micro light-emitting diode package structure as claimed in claim 10, wherein the control circuit board has a first top surface away from the first base layer, the filling material layer has a third top surface away from the first base layer, and the first top surface is aligned with the third top surface.

12. The micro light-emitting diode package structure as claimed in claim 1, further comprising:
an insulating layer, disposed between the first base layer and the second base layer, wherein the control circuit board comprises a first pad, the micro light-emitting diode assembly of the display unit directly contacts the insulating layer, and the insulating layer has a channel exposing the first pad; and
a conductive structure, disposed in the channel and electrically connected to the first pad.

13. The micro light-emitting diode package structure as claimed in claim 1, wherein the first base layer is an insulating material layer.

14. A micro light-emitting diode display apparatus, comprising:
a driving substrate; and
a plurality of micro light-emitting diode package structures, separately arranged on the driving substrate and electrically connected to the driving substrate, wherein each of the micro light-emitting diode package structures comprises:
a first base layer;
a second base layer, disposed on the first base layer, and having a first surface and a second surface opposite to each other and an opening passing through the second base layer and connecting the first surface and the second surface, wherein the opening has a top end and a bottom end opposite to each other, and the top end is connected to the first surface, the bottom end is connected to the second surface and located between the top end and the first base layer, wherein the bottom end of the opening exposes a part of the first base layer, and the opening and the exposed first base layer define a containing groove; and
a display unit, disposed in the containing groove, and the display unit comprising:
a control circuit board, wherein at least a portion of the control circuit board is located between the top end of the opening and the first base layer; and
a micro light-emitting diode assembly, disposed on the control circuit board, and electrically connected to the control circuit board.

* * * * *